(12) United States Patent
Grigg et al.

(10) Patent No.: US 6,926,191 B2
(45) Date of Patent: Aug. 9, 2005

(54) PROCESS FOR FABRICATING EXTERNAL CONTACTS ON SEMICONDUCTOR COMPONENTS

(75) Inventors: Ford Grigg, Meridian, ID (US); Kenneth N. Glover, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 10/437,214

(22) Filed: May 13, 2003

(65) Prior Publication Data

US 2003/0201309 A1 Oct. 30, 2003

Related U.S. Application Data

(62) Division of application No. 10/068,819, filed on Feb. 5, 2002, now Pat. No. 6,854,633.

(51) Int. Cl.[7] ............................................. B23K 31/02
(52) U.S. Cl. .................. 228/180.22; 228/214; 228/223; 156/330
(58) Field of Search .......................... 228/248.1, 248.5, 228/33, 41, 223, 224, 207, 214; 148/23–25; 156/182, 330

(56) References Cited

U.S. PATENT DOCUMENTS

| | | |
|---|---|---|
| 5,128,746 A | 7/1992 | Pennisi et al. |
| 5,211,763 A | 5/1993 | Takemoto et al. |
| 5,385,636 A | 1/1995 | Poingt et al. |
| 5,417,771 A | 5/1995 | Arita et al. |
| 5,482,736 A * | 1/1996 | Glenn et al. ................ 427/97.2 |
| 5,611,476 A * | 3/1997 | Soderlund et al. ............ 228/42 |
| 5,851,311 A | 12/1998 | Diamant et al. |
| 5,880,017 A | 3/1999 | Schwiebert et al. |
| 5,904,782 A | 5/1999 | Diep-Quang |
| 5,989,362 A | 11/1999 | Diamant et al. |
| 6,053,398 A | 4/2000 | Iizuka et al. |
| 6,059,173 A | 5/2000 | Mays et al. |
| 6,059,894 A | 5/2000 | Pendse |
| 6,063,647 A | 5/2000 | Chen et al. |
| 6,100,175 A | 8/2000 | Wood et al. |
| 6,118,179 A | 9/2000 | Farnworth et al. |
| 6,168,972 B1 | 1/2001 | Wang et al. |
| 6,180,504 B1 * | 1/2001 | Farnworth et al. .......... 438/612 |
| 6,184,581 B1 | 2/2001 | Cornell et al. |
| 6,204,080 B1 | 3/2001 | Hwang |
| 6,234,379 B1 | 5/2001 | Donges |
| 6,259,036 B1 | 7/2001 | Farnworth |
| 6,260,264 B1 | 7/2001 | Chen et al. |
| 6,276,599 B1 | 8/2001 | Ogawa |
| 6,283,358 B1 | 9/2001 | Ball |
| 6,293,456 B1 | 9/2001 | MacKay |
| 6,297,560 B1 | 10/2001 | Capote et al. |
| 6,352,881 B1 | 3/2002 | Nguyen et al. |
| 6,402,013 B2 * | 6/2002 | Abe et al. ................... 228/223 |
| 2003/0051770 A1 | 3/2003 | Nishina et al. |

FOREIGN PATENT DOCUMENTS

WO WO 99/21226 4/1999

* cited by examiner

*Primary Examiner*—Kiley S. Stoner
(74) *Attorney, Agent, or Firm*—Stephen A. Gratton (57) ABSTRACT

A polymer masking flux for fabricating external contacts on semiconductor components includes a polymer resin, a fluxing agent and a curing agent. The flux is configured to clean contact pads for the external contacts, and to hold the external contacts on the contact pads during a reflow bonding process. The flux is also configured to cure or polymerize, to form donut shaped polymer support members for the external contacts. In addition, the flux is configured to mask conductive traces in electrical communication with the contact pads, and to electrically insulate the external contacts from the conductive traces. The external contacts can be pre-formed solder balls, or deposited solder bumps. In the case of solder bumps, the flux can include solder particles configured to coalesce into the solder bumps.

36 Claims, 5 Drawing Sheets

PROCESS FOR FABRICATING EXTERNAL CONTACTS ON SEMICONDUCTOR COMPONENTS

CROSS REFERENCE TO RELATED APPLICATIONS

This application is a division of Ser. No. 10/068,819 filed on Feb. 5, 2002, now U.S. Pat. No. 6,854,633.

FIELD OF THE INVENTION

This invention relates generally to semiconductor packaging, and more particularly to a masking flux for fabricating external contacts, such as solder balls and solder bumps, on semiconductor components.

BACKGROUND OF THE INVENTION

Semiconductor components, such as packages, dice and wafers include external contacts which provide input/output paths to the integrated circuits contained on the components. For surface mount components, the external contacts typically comprise solder balls, or solder bumps, bonded to contact pads on the component. For some components, such as chip scale packages and BGA packages, the external contacts can be arranged in a dense grid array, such as a ball grid array (BGA), or a fine ball grid array (FBGA).

One conventional method for forming external contacts uses pre-formed solder balls, and a solder reflow bonding process. A prior art solder reflow bonding process is illustrated in FIGS. 1A–1D.

Figures 1A, 1B:
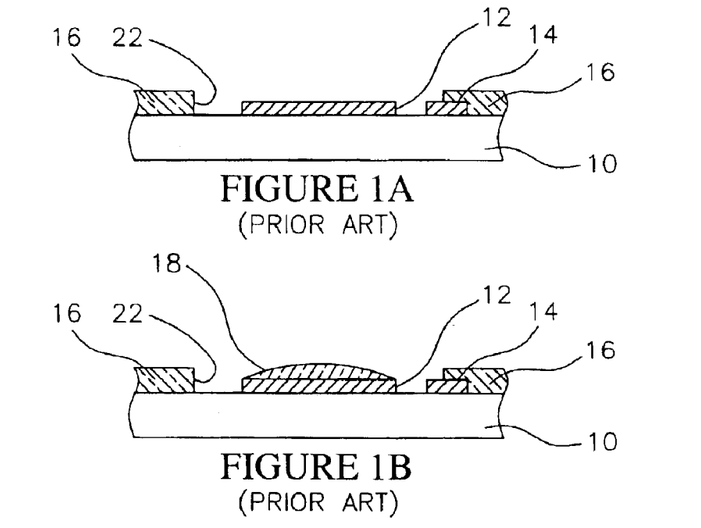
FIGS. 1A–1D are schematic cross sectional views illustrating a prior art reflow bonding process for solder balls.

As shown in FIG. 1A, a semiconductor component 10 includes a pattern of contact pads 12 in electrical communication with the integrated circuits and semiconductor devices contained on the component 10. The contact pads 12 typically comprise a solder wettable metal such as chrome, titanium or nickel. The component 10 also includes a pattern of conductive traces 14 in electrical communication with the contact pads 12. In addition, the component 10 includes an electrically insulating solder mask 16 having openings 22 aligned with the contact pads 12. The solder mask 16 substantially covers the conductive traces 14, but as illustrated in FIG. 1A, the openings 22 sometimes expose portions of the conductive traces 14 that are in close proximity to the contact pads 12.

As shown in FIG. 1B, during the bonding process, a layer of flux 18 is deposited on the contact pads 12 using a suitable deposition process such as screen printing or pin transfer. The flux 18 chemically attacks surface oxides, such that the molten solder can wet the surfaces to be bonded. Typically, the flux has either a rosin based or a water soluble chemistry.

Figure 1C:
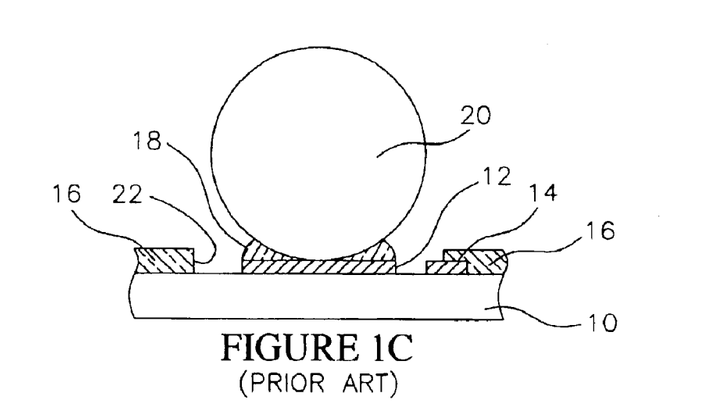

As shown in FIG. 1C, following application of the flux 18, pre-formed solder balls 20 can be placed on the contact pads 12 in physical contact with the flux 18. Typically, the solder balls 20 have the shape of a sphere, or a truncated sphere. Although a fixture can be used to center and maintain the solder balls 20 on the contact pads 12, the flux 18 also performs a tacking function for holding the solder balls 20 on the contact pads 12 during the bonding process.

Following placement of the solder balls 20 on the contact pads 12, the component 10 can be placed in a furnace at a temperature sufficient to reflow and metallurgically bond the solder balls 20 to the contact pads 12. The component 10 can then be removed from the furnace and cooled. The component 10 can then be surface mounted to a supporting substrate, such as a printed circuit board, by bonding the solder balls 20 to corresponding electrodes on the supporting substrate.

In addition to reflowing the solder balls 20, the high temperatures encountered in the furnace can cause most of the flux 18 to vaporize in the furnace. However, a flux cleaning step is also required to remove any flux residue that remains on the contact pads 12 and component 10. The flux cleaning process can be performed using a hydrocarbon for a rosin based flux, or water with surfactants for a water soluble flux.

Figure 1D:
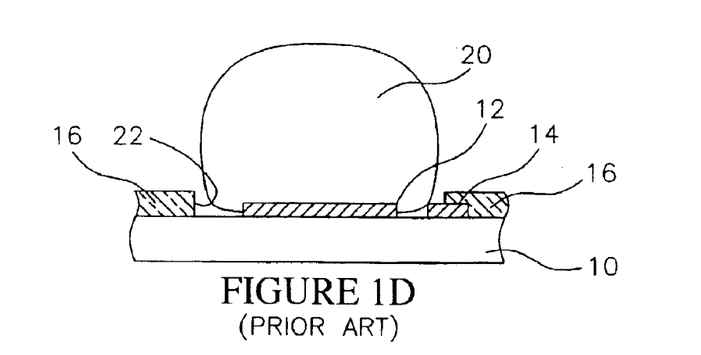

One factor that can adversely affect the reliability of the component 10 is shorting caused by distortion of the solder balls 20. As shown in FIG. 1D, distortion of the solder balls 20 can cause portions of the solder balls 20 to touch exposed portions of the conductive traces 14. It would be advantageous for a flux to be curable and electrically insulating, such that shorting between the solder balls 20 and the conductive traces 14 can be eliminated. Another factor that can affect the reliability of the component during normal operation is fatigue failure of the solder balls 20, particularly at the interfaces with the contact pads 12 and the electrodes on the supporting substrate. Typically, fatigue failures are induced by thermal expansion mismatches between the component and the supporting substrate. For example, if the component 10 comprises a first material, such as silicon having a first TCE (thermal coefficient of expansion), and the supporting substrate comprises a second material, such as FR-4 having a second TCE, cyclic forces can be placed on the solder balls 20 as the component 10 is thermally cycled during normal operation.

These forces can include tensile forces, moment forces and shear forces. If the forces are large enough, the solder balls 20 can separate from the contact pads 12 forming an electrical open. The separation can also compromise the physical bond between the component 10 and the supporting substrate. This problem is compounded because the area of interface between the solder balls 20 and the contact pads 12 is relatively small, such that the forces are concentrated over a relatively small area.

It would be advantageous for a flux to have the capability to support and rigidify the solder balls 20, or other external contacts, on a semiconductor component 10, during normal operation of the component 10. The present invention is directed to an improved flux configured to form a rigidifying structure for the external contacts. In addition, the flux is formulated to remove oxides from the components, is curable for reducing vapors during the fabrication process, and is electrically insulating for masking conductive traces for the external contacts.

SUMMARY OF THE INVENTION

In accordance with the present invention, an improved polymer masking flux for fabricating external contacts on semiconductor components, a bonding system that includes the flux, and improved components fabricated using the flux, are provided.

In an illustrative embodiment the component comprises a semiconductor package, a semiconductor die, or a semiconductor wafer, and the external contacts comprise solder balls. The component includes a substrate, contact pads on the substrate and conductive traces in electrical communication with the contact pads. The component also includes a solder mask having openings aligned with the contact pads.

The flux is configured to clean surface oxides from the contact pads during reflow bonding of the solder balls to the contact pads. In addition, the flux masks exposed portions of the conductive traces, and prevents electrical shorting between the solder balls and the conductive traces. The flux is also configured to cure, or polymerize, in a reflow furnace, and form polymer support members for the solder balls. The polymer support members are donut shaped elements that rigidify, and absorb forces acting on the solder balls during subsequent use of the component. Each polymer support member surrounds a base portion of a solder ball, and has a thickness approximately equal to one tenth to one half the diameter of the solder balls.

The flux includes an electrically insulating polymer resin such as an epoxy resin, a silicone resin, natural rubber or synthetic rubber. The polymer resin provides a base material which cures or polymerizes into the polymer support members. In addition, the flux includes a fluxing agent, such as an organic acid, for cleaning and removing oxides from the surface of the contact pads and the solder balls. The flux also includes a curing agent or hardener, such as a reactant or a solvent, that reacts with and cures the polymer resin in the reflow furnace. Because the flux cures into the polymer support members, vapors in the reflow furnace are reduced, and there is no need to perform a flux cleaning step on the component following the reflow bonding process.

The flux is a relatively thick viscous material that has non-flowing characteristics over a selected temperature range. This allows an exact quantity of the flux to be deposited onto the contact pads as a droplet using pin transfer, nozzle deposition or screen printing processes. The droplet maintains it's shape, remains on the contact pads, and provides high adhesion for tacking the solder balls to the contact pads during the reflow bonding step. The flux can be used at the wafer level during the fabrication of multiple components at the same time (i.e., wafer level fabrication process), or can be employed on singulated components such as individual dice or packages (i.e., die level fabrication process).

A system for bonding the solder balls to the semiconductor component includes the flux, and a flux dispensing mechanism configured to deposit the droplets of flux onto the contact pads. The system also includes a conveyor, a ball placement mechanism and a reflow furnace.

The flux can also be used to fabricate external contacts in the form of solder bumps, rather than solder balls. In this case the flux again includes the polymer resin, the fluxing agent, and the curing agent. The flux also includes micro solder particles configured to coalesce into the solder bumps. The flux is initially deposited onto the contact pads using a deposition process, such as screen printing, or nozzle deposition. The polymer resin masks exposed portions of the conductive traces, and the fluxing agent cleans surface oxides from the contact pads. Following deposition, the flux is reflowed by heating the components in a reflow furnace. During the reflow step, the solder particles and the polymer resin separate, such that the solder particles form the solder bumps, and the polymer resin forms polymer support members for the solder bumps.

DETAILED DESCRIPTION OF THE PREFERRED EMBODIMENT

As used herein, the term "semiconductor component" means an electronic component that includes a semiconductor die. Exemplary semiconductor components include bare semiconductor dice, chip scale packages, ceramic or plastic semiconductor packages, BGA devices, semiconductor wafers, and panels and leadframe, containing multiple dice or chip scale packages.

Referring to FIGS. 2A–2D, and FIGS. 3A–3D, a process for fabricating external contacts on a semiconductor component 28 using a polymer flux formulated in accordance with the invention is illustrated.

Figure 2A:
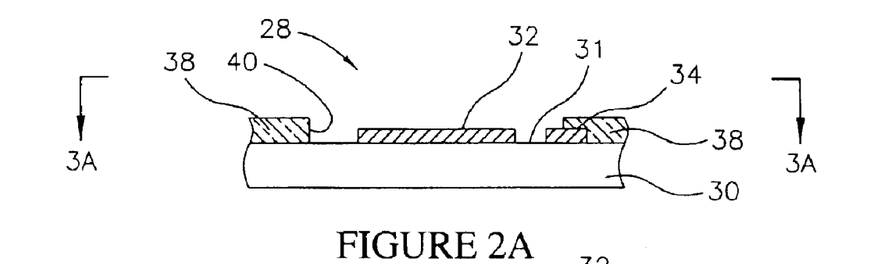
FIGS. 2A–2D are schematic cross sectional views illustrating a reflow bonding process performed using a preformed solder ball and a flux formulated in accordance with the invention.
Figure 3A:
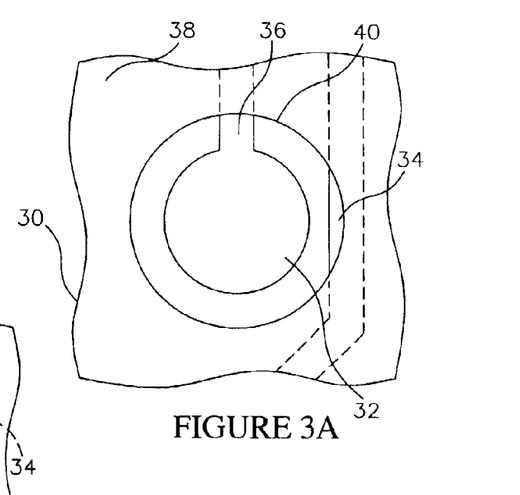
FIG. 3A is a cross sectional view taken along section line 3A—3A of FIG. 2A.

As shown in FIGS. 2A and 3A, the semiconductor component 28 is provided, and includes a substrate 30. The substrate 30 can be provided as a wafer, a panel, or a leadframe, containing a plurality of components 28 that can be singulated following the fabrication process (i.e., wafer level process). Alternately, the component 28 and the substrate 30 can comprise a singulated element, such as an individual package or die. Depending on the component 28, the substrate 30 can comprise a semiconductor material, such as silicon, or a plastic material, such as bismaleimide triazine (BT), or a polyimide resin.

The substrate 30 includes a surface 31, and a contact pad 32 on the surface 31. For simplicity only one contact pad 32 is shown. However, the substrate 30 includes a plurality of contact pads 32 arranged in a desired pattern such as a dense grid array. The contact pad 32 comprises a solder wettable material such as copper, tin, lead, palladium, platinum, nickel, chrome, titanium or gold.

The substrate 30 also includes a conductive trace 36 (FIG. 3A) in electrical communication with the contact pad 32. The conductive trace 36 establishes electrical communication between the contact pad 32 and the integrated circuits contained on the component 28. The substrate 30 also includes a conductive trace 34 in electrical communication with another contact pad that is not illustrated. The conductive traces 34, 36 comprise a highly conductive material such as aluminum, titanium, nickel, iridium, copper, gold, tungsten, silver, platinum, palladium, tantalum, molybdenum or alloys of these metals.

The substrate 30 also includes a mask 38 having an opening 40 aligned with the contact pad 32. The mask 38 comprises an electrically insulating material, such as a photoimageable resist. The mask 38 electrically insulates the conductive traces 34, 36 and prevents shorting between the contact pad 32 and adjacent contact pads. As shown in FIG. 3A, in addition to exposing the contact pad 32, the opening 40 in the mask 38 also exposes portions of the conductive traces 34, 36.

Figure 2B:
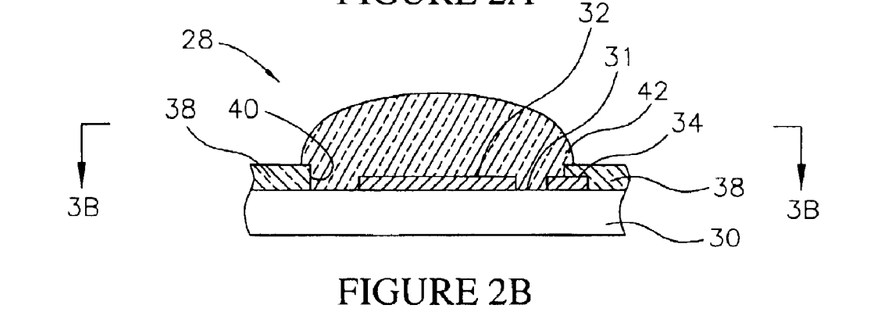
Figure 3B:
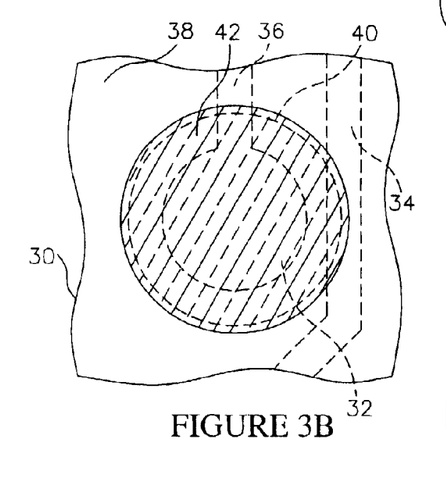
FIG. 3B is a cross sectional view taken along section line 3B—3B of FIG. 2B.

Next, as shown in FIGS. 2B and 3B, a flux deposition step is performed in which a droplet 42 of polymer masking flux is deposited through the opening 40 in the mask 38 onto the contact pad 32. Again, although only a single droplet 42 of flux is illustrated, it is understood that the component 28 will include as many droplets as there are contact pads 32, but only one droplet 42 per contact pad 32. In the illustrative embodiment, the droplet 42 covers the contact pad 32, completely fills the opening 40, and covers the exposed portions of the conductive traces 34, 36. The size of the droplet 42 will depend on the size of the contact pad 32 and the opening 40. In addition, the droplet 42 has a generally dome shaped topography with a convex surface.

The droplet 42 can be deposited on the contact pad 32 using a suitable deposition process, such as pin transfer, positive displacement through a nozzle, or screen printing. A suitable pin transfer mechanism is included in a ball placement system manufactured by Motorola of Phoenix, Ariz. as a model no. MS250PLUS. A suitable positive displacement mechanism is a "MICRO PEN" manufactured by Ohmcraft, Inc. of Pittsford, N.Y. Another suitable positive displacement mechanism is a "2800" liquid dispensing system manufactured by Camelot Systems, Inc. of Haverhill, Mass. With screen printing a stainless steel or monofilament polyester screen can be stretched and attached to a metal frame. A negative pattern can then be generated on the mesh using a photosensitive emulsion. The flux can then be forced through screen and onto the contact pad 32.

The polymer masking flux is formulated to meet environmental standards recognized in the semiconductor industry. In addition, the polymer masking flux is formulated with a viscosity that allows the droplet 42 to have non-flowing characteristics at a selected temperature range, such as room temperature (e.g., 60° F. to 100° F. or 15.5° C. to 37.8° C.). This viscosity allows the polymer masking flux to maintain a desired size and shape, and to remain in a desired area of the substrate 30 over the temperature range. By way of example, the polymer masking flux can have a viscosity at a temperature of about 25° C. of about 100 to 1500 poise. In this case the viscosity can be measured using a spiral/Malcom viscometer at 25 rpm.

As a primary constituent the polymer masking flux includes an electrically insulating polymer resin such as an epoxy resin, a silicone resin, natural rubber, synthetic rubber, or similar elastomeric material having suitable non-flowing and curable properties. By way of example, specific polymer resins include, but are not limited to: pthalate-actate hydroxyl copolymer, dibutyl isobutyl diphenol cellulose copolymer, and butyl phenol ketyl vinyl acetate polymer.

The polymer masking flux also includes a fluxing agent, such as an organic acid, for cleaning and removing oxides from the surface of the contact pads 42 and the solder balls 44. Suitable fluxing agents include carboxylic acid, abietic acid, citric acid, 2-furoic acid, malic acid and polyacrylic acid. A representative proportion of the fluxing agent as a volume percentage of the total volume of the droplet 42 can be from about 0.1% to 16%.

The polymer masking flux also includes a curing agent or hardener, such as a reactant or a solvent, that reacts with and cures the polymer resin over a selected temperature range and time period. Suitable curing agents include amines, anhydrides, and butyl carbitol acetate. The fluxing agent and the curing agent can also comprise a same chemical compound. By way of example, the curing agent can be included in the polymer resin in a quantity sufficient to cure the polymer resin at a temperature of between about 200° C. to 250° C. in about 1 to 2 minutes. The curing process can be performed simultaneous with a reflow step using a reflow furnace to be hereinafter described. If required, a final cure can also be performed at a lower temperature for a longer time period. In this case a batch oven can be used to perform the final cure.

Figure 2C:
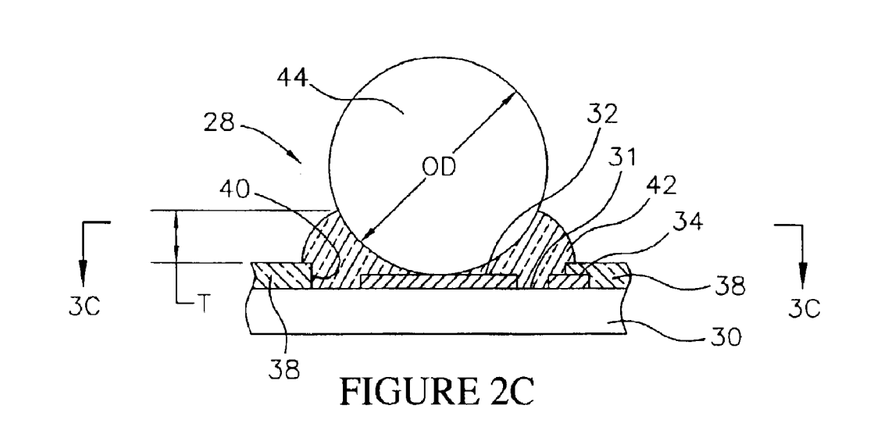
Figure 3C:
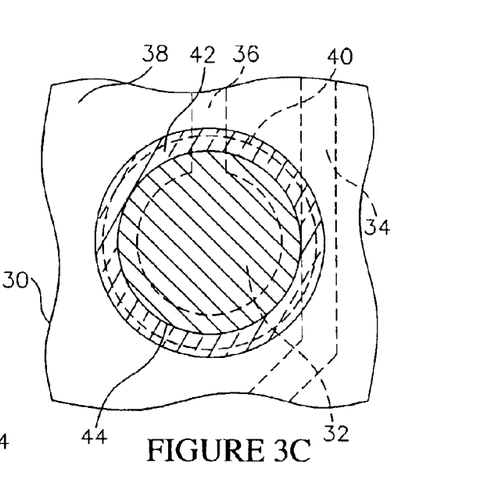
FIG. 3C is a cross sectional view taken along section line 3C—3C of FIG. 2C.

As shown in FIG. 2C and FIG. 3C, following the droplet deposition step, a ball placement step is performed in which a solder ball 44 is placed on the droplet 42, and pushed into contact with the contact pad 32. Preferably, the ball placement step is performed at room temperature such that the viscous properties of the droplet 42 are maintained. In this viscous condition, the droplet 42 also has adhesive properties that hold the solder ball 44 on the contact pad 32 with an adhesive force. The ball placement step must be performed with sufficient force to permit the solder ball 44 to displace the middle portion of the droplet 42, and physically contact the contact pad 32.

The solder ball 44 can be formed separately out of a suitable solder alloy, such as 95%Pb/5%Sn, 60%Pb/40%Sn, 63%Sn/37%Pb, or 62%Pb/36%Sn/2%Ag. A representative range for the outside diameter (OD) of the solder ball 44 can be from about 0.002-in (0.050 mm) to 0.025-in (0.675 mm). A representative thickness T of the droplet 42, with the solder ball 44 in contact with the contact pad 32, can be from about one tenth to one half the outside diameter of the solder ball 44.

The solder ball 44 can be pushed through the droplet 42, and placed on the contact pad 32 using a suitable ball placement mechanism. Such a ball placement mechanism is included in the previously identified ball placement system MS250PLUS manufactured by Motorola. Another suitable ball placement mechanism is disclosed in U.S. Pat. No. 6,100,175 to Wood et al. entitled "Method And Apparatus For Attaching Balls To A Substrate".

Figure 2D:
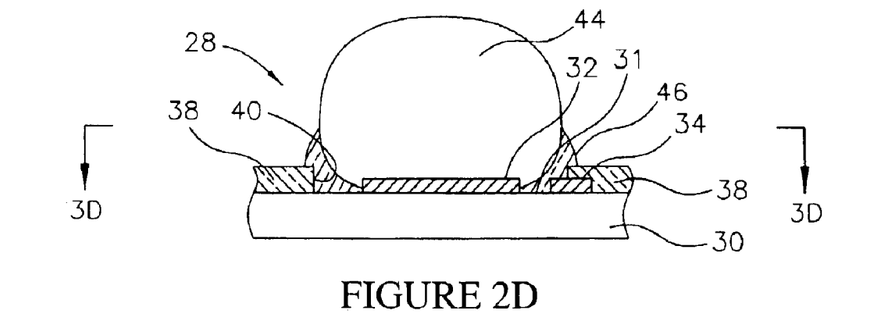
Figure 3D:
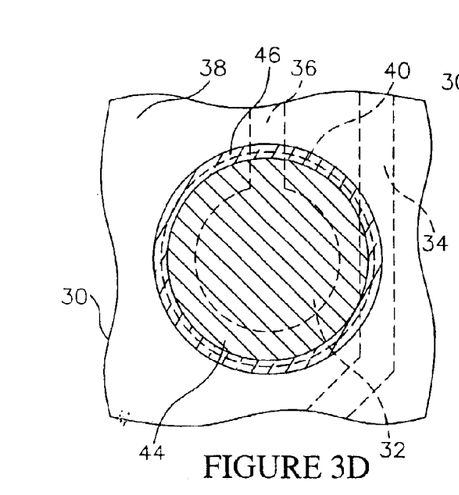
FIG. 3D is a cross sectional view taken along section line 3D—3D of FIG. 2D.

Next, as shown in FIG. 2D and FIG. 3D, a heating or reflow step is performed in which the component 28 is placed in a furnace, and the solder ball 44 is heated to a temperature sufficient to reflow the solder. During the heating step, the reflowed solder ball 44 metallurgically bonds to the contact pad 32. Also during the heating step, the droplet 42 of flux polymerizes, or cures, into a polymer support member 46.

As shown in FIG. 3D, the polymer support member 46 is a donut shaped structure (torus) resting on the surface 31 of the substrate 30, and encompassing the base portion of the solder ball 44. The polymer support member 46 helps to support and rigidify the solder ball 44 during subsequent operation of the component 28. In this regard, the polymer support member 46 bonds to the solder ball 44, bonds to the opening 40 in the mask 38, and bonds to the surface of the mask 38 to provide a rigidifying structure anchored to the substrate 30.

In addition to performing a supporting and rigidifying function, the polymer support member 46 also performs a masking and electrical insulating function. Specifically, the polymer support member 46 masks the exposed portions of the conductive trace 34, and prevents shorting between the solder ball 44 and the conductive trace 34. In addition, the polymer support member 46 provides an electrically insulating material in the opening 40, and between the solder ball 44 and the conductive trace 34.

Figure 4A:
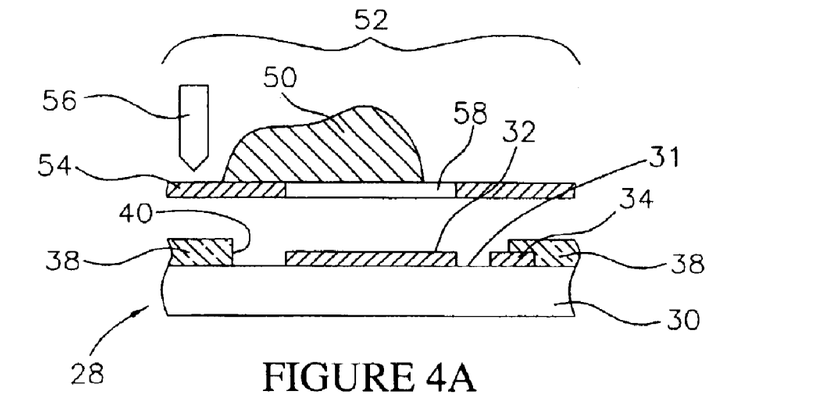
FIGS. 4A–4C are schematic cross sectional views illustrating a reflow bonding process performed using a polymer flux fabricated in accordance with an alternate embodiment of the invention.
Figure 4B:
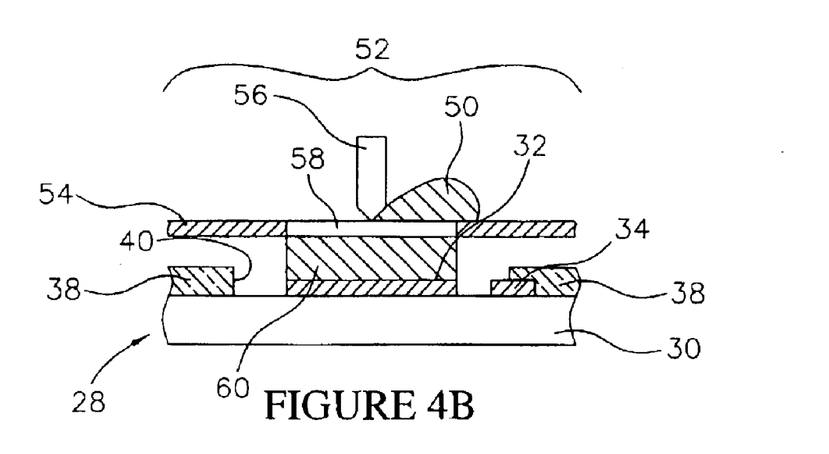
Figure 4C:
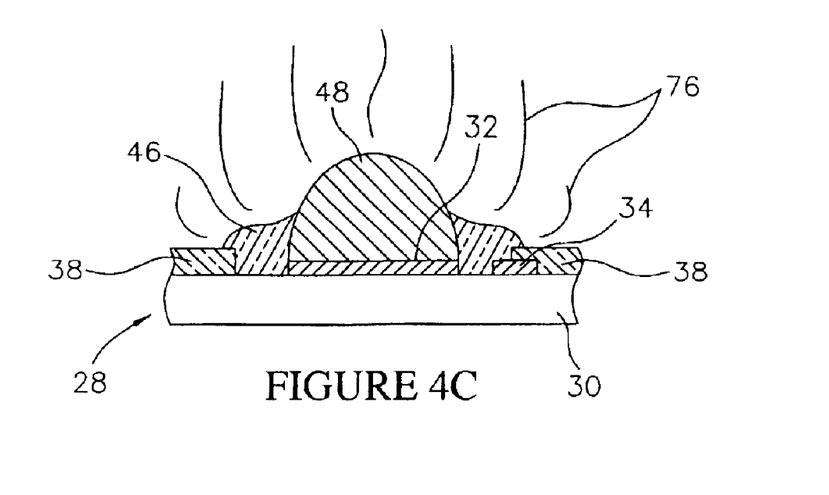

Referring to FIGS. 4A–4C, a process for fabricating solder bumps 48 (FIG. 4C) using the polymer masking flux are illustrated. Initially, as shown in FIG. 4A, the component 28 is provided and includes the substrate 30, the contact pad 32, the conductive trace 34, the mask 38, and the opening 40 in the mask 38, substantially as previously described.

As also shown in FIG. 4A, a deposition apparatus 52 is provided. The deposition apparatus is configured to deposit a polymer masking flux 50 on the contact pad 32. The polymer masking flux 50 includes a polymer resin formulated with the previously described characteristics, a fluxing agent for cleaning the contact pad 32 and a curing agent for curing the polymer resin. The polymer masking flux 50 also includes solder particles having a desired particle size distribution.

In the illustrative embodiment, the deposition apparatus 52 comprises a screen printer comprising a screen 54 having an opening 58, and a squeegee 56 configured to push the polymer flux 50 through the opening 58 onto the contact pad 32. Alternately, the deposition apparatus can comprise a positive displacement mechanism as previously described, configured to dispense the polymer masking flux 50 under pressure through a nozzle.

Next, as shown in FIG. 4B, a flux deposition step is performed. During this step, the squeegee 56 is used to force the polymer masking flux 50 through the opening 58 in the screen 54, and onto the contact pad 32, to form a droplet 60 of flux. During the deposition step the polymer masking flux 50, and the droplet 60, are viscous, uncured, and non-flowing substantially as previously described. In addition, the droplet 60 has a peripheral shape corresponding to the peripheral shape of the opening 58 (e.g., circular, square, rectangular). The droplet 60 has a height corresponding to the height of the screen 54 above the contact pad 32.

Next, as shown in FIG. 4C, a reflow bonding step is performed in a furnace substantially as previously described. During the reflow bonding step the droplet 60 of polymer masking flux 50 is heated to a temperature sufficient to coalesce the solder particles therein into a generally hemispherically shaped solder bump 48. In addition, during the reflow bonding step the polymer resin separates from the solder particles, moves outward, and polymerizes into the polymer support member 46.

Also during the reflow bonding step, the polymer resin in the droplet 60 masks and electrically insulates the conductive trace 34, substantially as previously described. As before, the curing mechanism can comprise outgassing of a solvent during heating as indicated by vapor trails 76. As also previously described, curing can be accomplished in a first stage at a relatively high temperature (e.g., 250° C.) for a relatively brief time (e.g., 1 minute), followed by a second stage at a lower temperature (e.g., 100° C. for a longer time (e.g., several minutes or more).

Figures 5A, 5B:
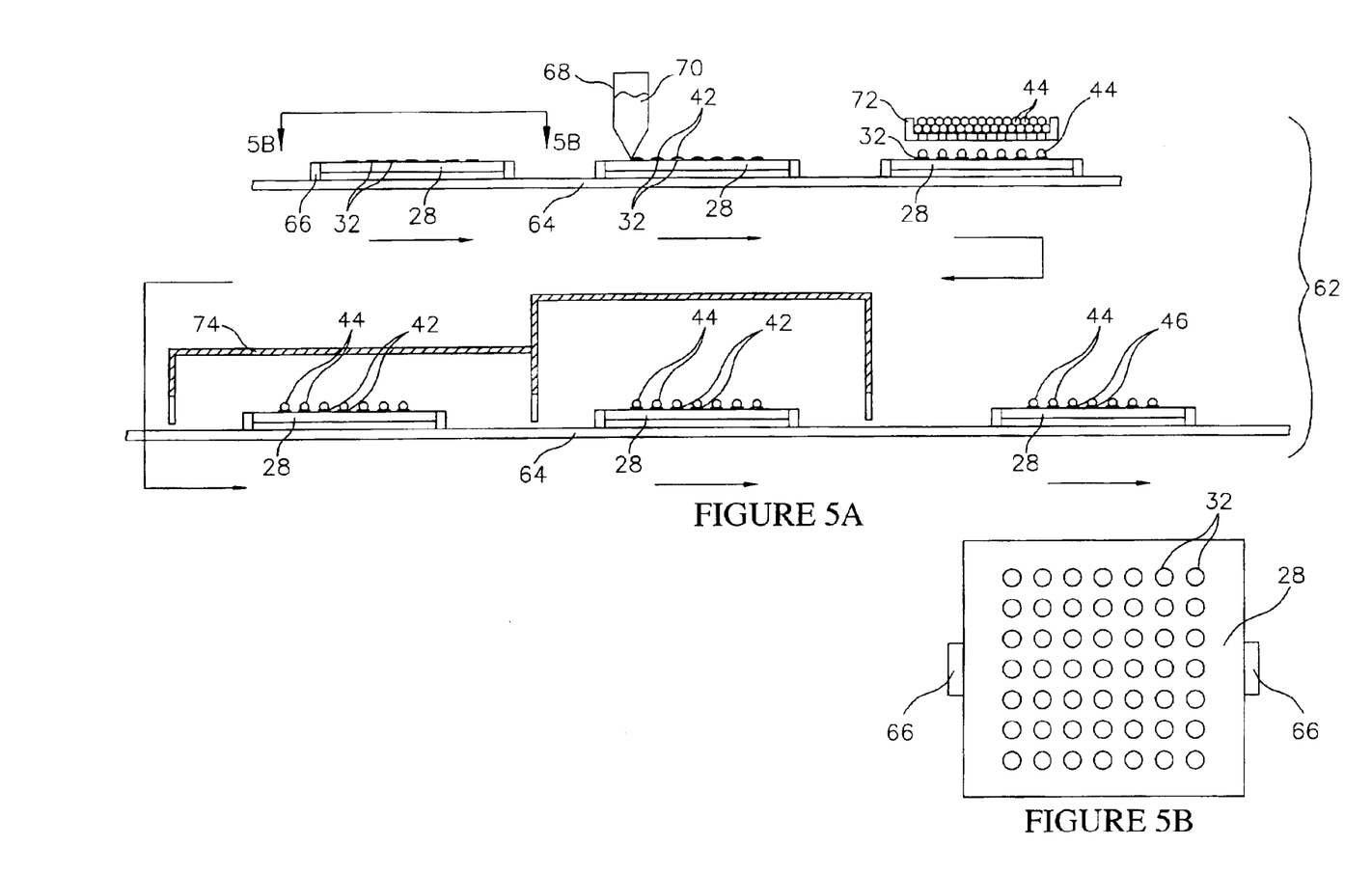
FIG. 5A is a schematic illustration of a system constructed in accordance with the invention for bonding external contacts to semiconductor components.
FIG. 5B is a plan view taken along line 5B—5B of FIG. 5A illustrating the component prior to bonding of the external contacts.

Referring to FIGS. 5A and 5B, a system 62 for bonding the solder balls 44 to the component 28 is illustrated schematically. The system 62 includes a conveyor 64 for moving the component 28 through the different stages of the system 62. The conveyor 28 includes lugs 66 for engaging the component 28. For example, the component 28 can be mounted to a leadframe or a panel having openings configured to engage the lugs 66. As shown in FIG. 5B, the component 28 includes the contact pads 32 formed substantially as previously described. In the illustrative embodiment, the contact pads 32 are generally circular in shape, and are arranged in a dense grid array of rows and columns.

As also shown in FIG. 5A, the system 62 includes a flux dispensing mechanism 68 configured to dispense a viscous polymer masking flux 70, formulated as previously described, onto the contact pads 32 to form the droplets 42. The flux dispensing mechanism 68 can comprise a pin transfer mechanism, a positive displacement mechanism having one or more nozzles, or a screen printing apparatus, all as previously described.

As also shown in FIG. 5A, the system 62 includes a ball placement mechanism 72 configured to place the solder balls 44 on the droplets 42 in physical contact with the contact pads 32 substantially as previously described. The system 62 also includes a two stage furnace 74 configured to reflow the solder balls 44, and to cure the droplets 42 to form the polymer support members 46 substantially as previously described. Suitable furnaces are available from Scientific Sealing Technology of Downey, Calif., Vitronics of New Hampshire, and Accel of Texas.

Thus the invention provides an improved polymer masking flux for fabricating external contacts on semiconductor components, a system for fabricating external contacts that includes the polymer flux, and improved semiconductor components fabricated using the polymer flux. While the invention has been described with reference to certain preferred embodiments, as will be apparent to those skilled in the art, certain changes and modifications can be made without departing from the scope of the invention as defined by the following claims.

What is claimed is:

1. A process for fabricating an external contact on a semiconductor component having a contact pad comprising:
   providing the component with a mask having an opening aligned with the contact pad;
   providing a flux comprising a fluxing agent, a polymer resin, and a curing agent;
   dispensing a droplet of the flux on the contact pad;
   placing a ball on the droplet; and
   forming the polymer resin into a polymer support member bonded to the ball, to the mask and to the opening.

2. The process of claim 1 wherein the component includes a conductive trace and the polymer support member electrically insulates the ball from the conductive trace.

3. The process of claim 1 further comprising heating the ball, the contact pad and the droplet during the forming step to cure the polymer resin and bond the ball to the contact pad.

4. The process of claim 1 wherein the flux has a viscosity during the dispensing step of about 100 to 1500 poise.

5. The process of claim 1 wherein the component comprises a package, a die, or a wafer.

6. The process of claim 1 wherein the forming step is performed using a furnace configured to reflow the ball and heat the contact pad.

7. The process of claim 1 wherein the fluxing agent comprises an acid.

8. The process of claim 1 wherein the polymer resin comprises a material selected from the class consisting of epoxy, silicone and rubber.

9. The process of claim 1 wherein the curing agent comprises a solvent or a reactant.

10. A process for fabricating an external contact on a semiconductor component having a contact comprising:
    providing a flux comprising a fluxing agent, a polymer resin, and a curing agent;
    forming a mask on the component having an opening aligned with the contact;
    dispensing a droplet of the flux through the opening onto the contacts;
    placing a ball on the droplet in contact with the contacts;

bonding the ball to the contact; and curing the polymer resin during the bonding step to form a polymer support member substantially surrounding the ball and bonded to the mask.

11. The process of claim 10 wherein the component includes a conductive trace in electrical communication with a second contact, and the polymer support member electrically insulates the ball from the conductive trace.

12. The process of claim 10 wherein the flux has non flowing characteristics during the dispensing step.

13. The process of claim 10 wherein the dispensing step is performed using a pin transfer mechanism, a nozzle or a screen.

14. The process of claim 10 wherein the ball comprises solder.

15. The process of claim 10 wherein the bonding step is performed using a furnace configured to reflow the ball and heat the contact.

16. A process for fabricating external contacts on a semiconductor component having a plurality of contact pads and conductive traces in electrical communication with the contact pads comprising:

providing a mask on the component having a plurality of openings aligned with the contact pads and at least one conductive trace;

providing a flux comprising a fluxing agent, a polymer resin, and a curing agent;

depositing a plurality of droplets of the flux into the openings in contact with the contact pads;

placing a plurality of balls on the droplets; and forming the droplets into polymer support members bonded to the balls, to the openings and to the mask, and masking the at least one conductive trace.

17. The process of claim 16 wherein the forming the droplets step comprises curing the polymer resin.

18. The process of claim 16 wherein the forming the droplets step comprises heating the droplets.

19. The process of claim 16 wherein the flux has non flowing characteristics during the depositing step.

20. The process of claim 16 further comprising bonding the balls to the contact pads during the forming step.

21. The process of claim 16 wherein the balls comprise solder.

22. A process for fabricating an external contact on a semiconductor component having a contact pad comprising:

providing a flux comprising a fluxing agent, a plurality of solder particles, a polymer resin, and a curing agent;

providing the component with a mask having an opening aligned with the contact pad;

dispensing a droplet of the flux through the opening onto the contact pad; and heating the droplet to form a solder bump on the contact pad and a polymer support member bonded to the mask and substantially surrounding the bump.

23. The process of claim 22 wherein the component includes a conductive trace and the polymer support member electrically insulates the bump from the conductive trace.

24. The process of claim 22 wherein the flux has a viscosity during the dispensing step of about 100 to 1500 poise.

25. The process of claim 22 wherein the component comprises a package, a die, or a wafer.

26. The process of claim 22 wherein the flux has non flowing characteristics during the dispensing step.

27. The process of claim 22 wherein the fluxing agent comprises an acid.

28. The process of claim 22 wherein the polymer resin comprises a material selected from the class consisting of epoxy, silicone and rubber.

29. The process of claim 22 wherein the curing agent comprises a solvent or a reactant.

30. A process for fabricating external contacts on a semiconductor component having a plurality of contact pads and conductive traces in electrical communication with the contact pads comprising:

providing a mask on the component having a plurality of openings aligned with the contact pads and at least one conductive trace;

providing a flux comprising a fluxing agent, a plurality of solder particles, a polymer resin, and a curing agent;

depositing a plurality of droplets of the flux into the openings in contact with the contact pads; and heating the droplets to coalesce the solder particles into bumps bonded to the contact pads, and form the polymer resin into polymer support members bonded to the bumps, to the openings and to the mask, and masking the at least one conductive trace.

31. The process of claim 30 wherein the flux has non flowing characteristics during the depositing step.

32. The process of claim 30 wherein the component comprises a package, a die, or a wafer.

33. A process for fabricating external contacts on a semiconductor component having a plurality of contacts comprising:

providing a flux comprising a fluxing agent, a plurality of solder particles, a polymer resin, and a curing agent;

forming a mask on the component having a plurality of openings aligned with the contacts;

depositing a plurality of droplets of the flux into the openings and on the contacts;

heating the droplets to coalesce the solder particles into bumps bonded to the contacts; and curing the droplets during the heating step to form polymer support members bonded to the bumps, to the contacts and to the mask.

34. The process of claim 33 wherein the polymer support members electrically insulate the bumps from at least one conductive trace on the component.

35. The process of claim 33 wherein the depositing step is performed using a pin transfer mechanism, a nozzle or a screen.

36. The process of claim 33 wherein the heating step is performed using a staged furnace.

* * * * *

UNITED STATES PATENT AND TRADEMARK OFFICE
CERTIFICATE OF CORRECTION

PATENT NO. : 6,926,191 B2
DATED : August 9, 2005
INVENTOR(S) : Ford Grigg and Kenneth N. Glover It is certified that error appears in the above-identified patent and that said Letters Patent is hereby corrected as shown below:

Column 8,
Lines 66 and 67, change "contacts" to -- contact --.

Signed and Sealed this

Fourth Day of October, 2005

JON W. DUDAS
*Director of the United States Patent and Trademark Office*